(12) United States Patent
Pinter

(10) Patent No.: US 8,648,433 B2
(45) Date of Patent: Feb. 11, 2014

(54) METHOD FOR PRODUCING OBLIQUE SURFACES IN A SUBSTRATE AND WAFER HAVING AN OBLIQUE SURFACE

(75) Inventor: Stefan Pinter, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 261 days.

(21) Appl. No.: 13/297,842

(22) Filed: Nov. 16, 2011

(65) Prior Publication Data

US 2012/0133004 A1 May 31, 2012

(30) Foreign Application Priority Data

Nov. 26, 2010 (DE) .................. 10 2010 062 009

(51) Int. Cl.
*H01L 21/00* (2006.01)
*G02B 26/08* (2006.01)

(52) U.S. Cl.
USPC ........ 257/419; 257/E29.324; 438/52; 438/53; 359/223.1; 359/224.1

(58) Field of Classification Search
USPC ............... 257/419, E29.324; 438/52, 53; 359/223.1, 224.1, 290
See application file for complete search history.

(56) References Cited

U.S. PATENT DOCUMENTS

| 5,174,587 | A | 12/1992 | Crawley |
| 2002/0135717 | A1 | 9/2002 | Liu |
| 2005/0257709 | A1 | 11/2005 | Mule et al. |
| 2006/0176539 | A1 | 8/2006 | Choi et al. |
| 2007/0024549 | A1 | 2/2007 | Choi et al. |
| 2010/0014147 | A1* | 1/2010 | Pinter et al. ............. 359/290 |
| 2010/0330332 | A1 | 12/2010 | Quenzer et al. |

FOREIGN PATENT DOCUMENTS

DE 102008012384 9/2009

* cited by examiner

*Primary Examiner* — Minh-Loan T Tran
(74) *Attorney, Agent, or Firm* — Kenyon & Kenyon LLP

(57) ABSTRACT

A method for producing oblique surfaces in a substrate, comprising a formation of recesses on both surfaces of the substrate, until the recesses are so deep that the substrate is perforated by the two recesses. One recess is produced going out from a first main surface in the region of a first surface, and the other recess is produced going out from the second main surface in the region of a second surface, so that the first surface and the second surface do not coincide along a surface normal of the main surfaces of the substrate. Subsequently, flexible diaphragms are attached over the recesses on each of the main surfaces. If a vacuum pressure is then produced inside the recesses, the flexible diaphragms each curve in the direction of the recesses until their surfaces facing the substrate come into contact with one another, generally in the center of the recesses.

9 Claims, 4 Drawing Sheets

(A-A')

(B-B')

(C-C')

METHOD FOR PRODUCING OBLIQUE SURFACES IN A SUBSTRATE AND WAFER HAVING AN OBLIQUE SURFACE

CROSS REFERENCE

The present application claims the benefit under 35 U.S.C. §119 of German Patent Application No. 102010062009.2 filed on Nov. 26, 2010, which is expressly incorporated herein by reference in its entirety.

FIELD OF THE INVENTION

The present invention relates to a method for producing oblique surfaces in a substrate, in particular in planar technology for semiconductor processing, as well as to a wafer having an oblique surface integrated in a substrate, in particular for covering a micromechanical element.

BACKGROUND INFORMATION

In the processing of semiconductors, planar structuring elements can be produced on or in substrates by depositing layers and subsequently structuring them, or through processes of etching the bulk material. This technology is known as planar technology.

An aspect of planar technology relates to the production of non-planar structures such as oblique or curved surfaces.

U.S. Pat. No. 5,174,587 describes an oblique etching process in which a photoresist layer is made to flow under a predetermined high temperature in order to form oblique photoresist edges that are then, in a subsequent etching step, etched together with the substrate situated thereunder to form oblique planes.

U.S. Patent Application Publication No. 2005/0257709 A1 describes a method in which optical or diffractive elements on a substrate are covered by a layer that is to be structured, and through a masking layer a region of the layer to be structured over the optical elements is exposed. The optical elements reflect the radiation and cast the light at an angle into a further region of the layer that is to be structured, so that obliquely exposed regions are formed.

U.S. Patent Application Publication No. 2002/0135717 A1 describes methods by which oblique surfaces can be fashioned by depositing organic layers over structured substrate elements.

In addition, lithographic methods are available, for example gray-tone or half-tone lithography, that can be used to produce regions in a substrate that are structured to different extents. The masking layers here are relatively thin, and the masking material can be selected such that during the etching only a slight abrasion occurs, for example via a high etching selectivity of the masking material relative to the substrate to be etched.

In particular for the covering of microelectromechanical systems having micromirrors by a window, oblique surfaces are often required in order to keep scattered light and undesired reflections of the light source away from the micromirror or from the projected image.

U.S. Patent Application Publication Nos. 2006/1076539 A1 and 2007/0024549 A1 describe methods in which preformed coverings having oblique surfaces are placed over micromirror arrays.

German Patent No. DE 10 2008 012 384 A1 describes methods for producing a glass wafer having beveled surfaces that can act as coverings for micromirrors.

However, in order to implement a large-scale production method for oblique and/or curved surfaces in a planar technology environment, it is desirable to provide more efficient and more economical methods.

SUMMARY

In accordance with the present invention, an example method is provided for producing oblique surfaces in a substrate by which oblique or curved surfaces can be produced precisely and with variability and flexibility in dimensions such as inclination, height, or curvature. The present invention also relates to a wafer having an oblique surface integrated in a substrate that can be produced according to an example method according to the present invention in order to provide a covering wafer for a micromechanical element.

According to a specific embodiment, a method for producing oblique surfaces in a substrate includes a formation of recesses on both main surfaces of the substrate, to respective depths whose sum is greater than the thickness of the substrate, i.e., until the recesses are so deep that the substrate is perforated by the two recesses. Here, one recess is produced starting from a first main surface in the region of a first surface and the other recess is produced starting from the second main surface in the region of a second surface, so that the first surface and the second surface do not coincide along a surface normal of the main surfaces of the substrate, i.e., the two surfaces are laterally offset relative to one another. This advantageously results in terraced substrate projections on opposite sides of the recesses. Subsequently, on the main surfaces flexible diaphragms are attached over each of the recesses. If a vacuum pressure is then built up inside the recesses relative to the external pressure, the flexible diaphragms each curve in the direction of the recesses until their surfaces facing the substrate come into contact with one another essentially in the center of the recesses. An advantage of the method is that due to the vacuum pressure the flexible diaphragms fit tightly against the outer edges of the substrate in the edge area of the recesses, in particular against the substrate projections, which form mounting points for a surface that results from the diaphragm surfaces contacting one another inside the recesses. In this way, it can advantageously be achieved that the surface that forms is oblique relative to the main surfaces of the substrate.

A further advantage of the example method according to the present invention is that the inclination, extension, and height of the oblique surfaces inside the recesses can easily be set via the dimensions of the recesses made in the substrate. In addition, the recesses can advantageously be produced in planar technology, so that the method according to the present invention for producing oblique surfaces is compatible with planar technology processes. As a result, the method is efficient, economical, and suitable for large-scale production.

The example method according to the present invention also has the advantage that a large number of geometrically oblique structures can be formed without making significant changes to the production process, and that for the oblique surfaces many materials differing from the substrate material may be used, and that the oblique surfaces can be made very precise and flat.

According to a specific embodiment, the vacuum pressure inside the recesses is produced by applying the flexible diaphragms to the substrate in a vacuum and bringing the substrate, with the hermetically sealed recesses, into an atmosphere of normal pressure, so that as a result of this process a vacuum pressure already exists inside the recesses. In this way, it can advantageously be achieved that the oblique surfaces organize and stabilize themselves.

According to a further specific embodiment of the present invention, a wafer is provided having a substrate that has a first main surface, a second main surface situated opposite the first main surface, and a thickness, the substrate having an opening that extends through the thickness of the substrate, the opening having a first lateral limiting edge and a second lateral limiting edge opposite the first lateral limiting edge. The wafer has a first substrate projection that protrudes into the opening from the first lateral limiting edge at the height of the first main surface, and has a second substrate projection that protrudes from the second lateral limiting edge into the opening at the height of the second main surface. The first and second substrate projection form mounting points for a diaphragm element that extends from the first substrate projection to the second substrate projection and, in the region of the opening, defines a surface that stands at an angle to the first main surface, i.e. obliquely.

Here it is particularly advantageous if the substrate is a silicon substrate and the diaphragm element includes borosilicate glass that is transparent in the optical range. In this way, it can be achieved that the wafer has an oblique window transparent to light that is suitable for covering a micromechanical element, in particular a micromirror, because it effectively eliminates disturbing scattered and reflected radiation.

The above embodiments and developments may be arbitrarily combined with one another to the extent that this is appropriate. Further possible embodiments, developments, and implementations of the present invention also include combinations not explicitly named of features of the present invention described above or in the following with regard to the exemplary embodiments.

The present invention is explained in more detail below on the basis of the exemplary embodiments shown in the schematic Figures.

BRIEF DESCRIPTION OF THE DRAWINGS

FIGS. 2b-2d show sectional views of the surface structure of a substrate shown in FIG. 2a.

DETAILED DESCRIPTION OF EXAMPLE EMBODIMENTS

Figure 1A:
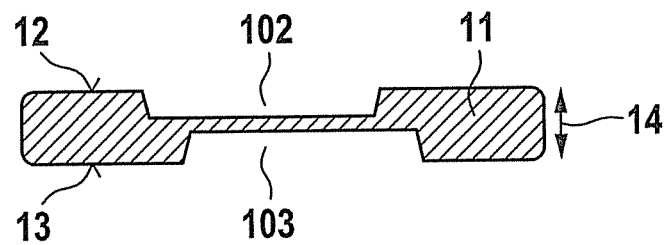
FIGS. 1a-1f show schematic representations of a method sequence according to a specific embodiment of the present invention.

In the Figures, identical and functionally identical elements, features, and components are provided with the same reference characters, unless otherwise stated. For reasons of clarity and comprehensibility, components and elements in the figures are not necessarily shown in their true scale relative to one another.

FIGS. 1a-1f schematically show a method sequence according to a specific embodiment of the present invention.

FIG. 1a shows a substrate 11 having a first main surface 12 and a second main surface 13 situated opposite first main surface 12. Substrate 11 has a thickness 14. In substrate 11, on the side of first main surface 12 there is made a first recess 102, and on the side of second main surface 13 there is made a second recess 103. As is shown here as an example, recesses 102, 103 can have a rectangular cross-sectional surface, but other cross-sectional shapes are also equally possible.

Substrate 11 can for example be made of silicon or can contain silicon. However, any other substrate material may also be used for substrate 11. Recesses 102, 103 can for example be made in planar technology by trench etching or etching using potassium hydroxide (KOH). This results in cuboidal recesses 102, 103.

The region of second recess 103 on second main surface 13 is laterally offset relative to the lateral extension of its cross-sectional surface relative to the region of first recess 102. In other words, the side edges in cuboidal recess 103 in substrate 11 are laterally offset relative to the side edges of cuboidal recess 102 in substrate 11. However, it can be provided that the region of second recess 103 has the same shape and dimensions as the region of first recess 102, for example a rectangular shape having the same side lengths.

Figure 1B:
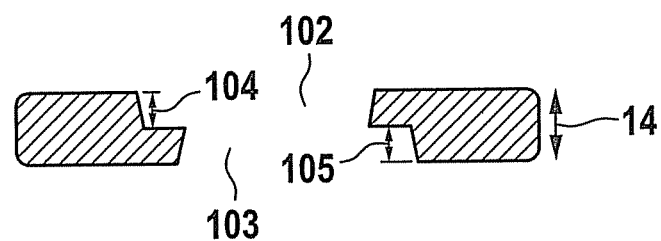

FIG. 1b shows substrate 11 after the formation of recesses 102 and 103. First recess 102 has been made in substrate 11 to a depth 104, and second recess 103 has been made in substrate 11 to a depth 105. Depths 104 and 105 can for example be controlled via the duration of an etching process. Here it is provided that the sum of the depth extensions of depths 104 and 105 is greater than or equal to thickness 14 of the substrate. This ensures that the floors of recesses 102 and 103 meet one another in the center of substrate 11, thus producing a perforation through the substrate in the region of recesses 102 and 103.

Figure 1C:
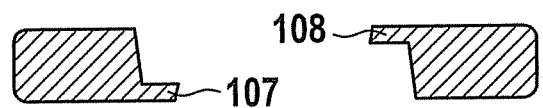

FIG. 1c shows substrate 11 after a further etching of recesses 102 and 103. Recesses 102 and 103 can be further etched after the formation of the perforation in substrate 11, so that substrate projections 107 and 108 can be formed. A first substrate projection 107 results from the forming of a first recess 102, from first main surface 12 of substrate 11, to a depth 104 that is less than thickness 14 of substrate 11. First substrate projection 107 then has a thickness that corresponds to thickness 14 minus depth 104. A second substrate projection 108 results from the formation of second recess 103, from second main surface 12 of substrate 11, to a depth 105 that is less than thickness 14 of substrate 11. Second substrate projection 108 then has a thickness that corresponds to thickness 14 minus depth 105, and is situated diagonally opposite first substrate projection 107, extending past the extension of the perforation and the extension of the overlapping region of the cross-sectional surfaces of the two recesses 102 and 103.

Figure 1D:
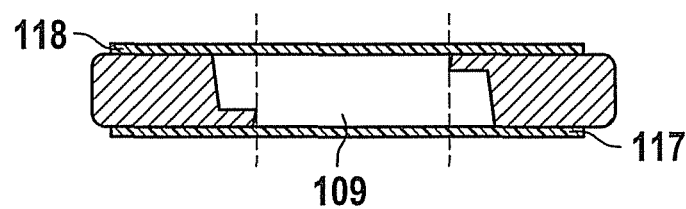

FIG. 1d shows substrate 11 after a further method step according to a specific embodiment of the present invention. A first flexible diaphragm element 118 is applied on first main surface 12 over first recess 102, and a second flexible diaphragm element 117 is applied on second main surface 12 over second recess 102. Flexible diaphragm elements 117, 118 can be for example plastic films. However, it is also possible to use borosilicate glasses such as Pyrex or Borofloat33 for flexible diaphragm elements 117, 118. Of course, any other material may also be suitable to form flexible diaphragm elements 117, 118. The thickness of flexible diaphragm elements 117, 118 is preferably approximately 10 to 200 μm, in particular approximately 30 μm, such as for example in the case of borosilicate glass film MEMPAX, or 100 μm for other commercially available borosilicate glasses.

Flexible diaphragm elements 117, 118 each have a surface that is larger than the first and second regions of recesses 102 and 103. In particular, flexible diaphragm elements 117, 118 are attached to main surfaces 12, 13 of substrate 11 in such a way that a pass-through area (indicated in broken lines) through substrate 11 is completely covered, and such that regions 117a, 118a on main surfaces 12, 13 of substrate 11 outside the first and second regions of recesses 102, 103 are also covered by flexible diaphragm elements 117, 118. These regions 117a, 118a act as support areas for the flexible diaphragm elements.

The application of flexible diaphragm elements 117, 118 on main surfaces 12, 13 creates an opening 109 that is laterally limited by the side edges of recesses 102, 103 and is limited along thickness 14 of substrate 11 by flexible diaphragm elements 117, 118. This opening 109 is sealed against the external space, and in particular it can be provided that opening 109 is hermetically sealed against the external space. This can be ensured by corresponding application of flexible diaphragm elements 117, 118 on substrate 11, for example by gluing, soldering, anodic bonding, or the like. It can advantageously be provided that flexible diaphragm elements 117, 118 are fixedly attached to substrate 11 in regions 117a, 118a. In particular, along main surfaces 12, 13 regions 117a, 118a can be situated at a distance from the side edges of recesses 102, 103, so that flexible diaphragm elements 117, 118 have a surface that lies over recesses 102, 103 that is larger than the surface of recesses 102, 103, and that is not rigidly connected to substrate 11.

This facilitates the lateral expansion of the diaphragm in the following method steps, explained in FIGS. 1e and 1f below.

The application of flexible diaphragm elements 117, 118 can for example take place in a vacuum atmosphere, so that due to the hermetic seal an evacuated space arises inside opening 109. However, it can also be possible to attach flexible diaphragm elements 117, 118 to substrate 11 under normal pressure.

Figure 1E:
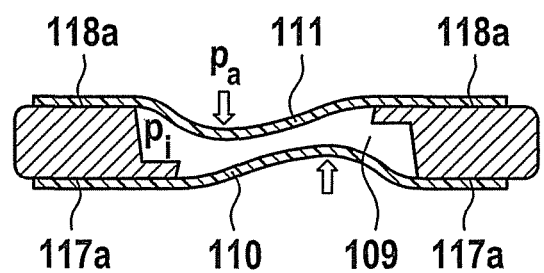

As FIG. 1e shows, a pressure $p_i$ prevails in opening 109. If a pressure difference is now applied between the external space and opening 109, flexible diaphragm elements 117, 118 begin to deform due to the resulting pressure force in regions 110 or 111. If the pressure in the external space is for example $p_a$, and the pressure in the internal space is $p_i$, and moreover $p_a > p_i$, pressure forces arise that are indicated in FIG. 1e by arrows. Regions 110 and 111 of flexible diaphragm elements 117, 118 are accordingly pressed into opening 109 from the side of the respective main surface 12 or 13, so that curvatures result in flexible diaphragm elements 117, 118. The form and degree of the curvature is determined here as a function of the diaphragm element material, thickness, and dimensions of diaphragm elements 117, 118, the dimensions of opening 109, the pressure difference $p_a-p_i$, the ambient temperature, and the duration of the curvature process. Given suitable external parameters, the curvature of flexible diaphragm elements 117, 118 takes place to such an extent that flexible diaphragm elements 117, 118 come into contact in regions 110 or 111. Here, flexible diaphragm elements 117, 118 undergo a lateral expansion in regions 110, 111. Due to the application of diaphragm elements 117, 118 in regions 117a, 118a, which are situated at a distance from the side edges of opening 109 along main surfaces 12, 13 of substrate 11, in the region of the side edges of the opening there advantageously result parts of flexible diaphragm elements 117, 118 that are not rigidly connected to substrate 11 by a glued connection, welded connection, soldered connection, or any similar connection. These parts can facilitate the lateral expansion of flexible diaphragm elements 117, 118 in regions 110, 111.

Figure 1F:
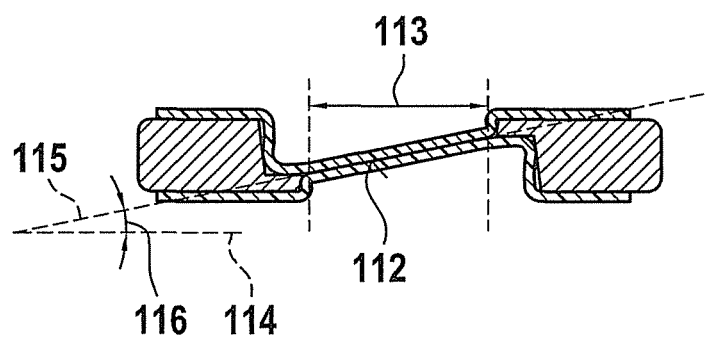

As FIG. 1f further shows, after the termination of the curvature process in FIG. 1e there results a region 113 inside the broken lines inside opening 109, within which flexible diaphragm elements 117, 118 are completely in contact with one another with their surfaces facing substrate 11. The formation of contact region 113 is a function of, inter alia, the geometry of the opening. In the present example, substrate projections 107, 108 act as anchor points for surface 112, which is mounted via flexible diaphragm elements 117, 118 that contact one another.

In the present example, direction of extension 115 of surface 112 forms, with direction of extension 114 of second (or first) main surface 13 (or 12), an angle 116 that corresponds to the angle of inclination of oblique surface 112. It will be understood that the embodiment shown in FIG. 1f is only an example of the realization of an oblique surface 112 within opening 109. The inclination of an oblique surface can be variably set via the lateral offset of the first and second regions of recesses 102, 103 on main surfaces 12, 13 of substrate 11, in combination with the dimensions, i.e., side length, etching depth, and the like, of recesses 102, 103.

Due to the mechanical tensions in flexible diaphragm elements 117, 118, oblique surface 112 in FIG. 1f is extremely smooth and flat. In the method having a glass element as diaphragm element 117 or 118 for forming surface 112, substrate 11, with flexible diaphragm elements 117, 118, can be brought to a suitably high temperature to enable a flowing of the glass. Here it can be provided that flexible diaphragm elements 117, 118 retain their shape during cooling. However, it can also be provided that flexible diaphragm elements 117, 118 are glued, welded, or soldered to substrate 11 in region 113 of their surface contact with one another, or in the region of the side edges of opening 109, in particular if normal pressure prevails inside opening 109 and a high pressure has been applied from outside in order to form surface 112. Upon relaxation of this external pressure, the pressure difference between the outer pressure and the inner pressure in opening 109 decreases, and flexible diaphragm elements 117, 118 could relax back into their original position if they had not been correspondingly joined.

Figure 2A:
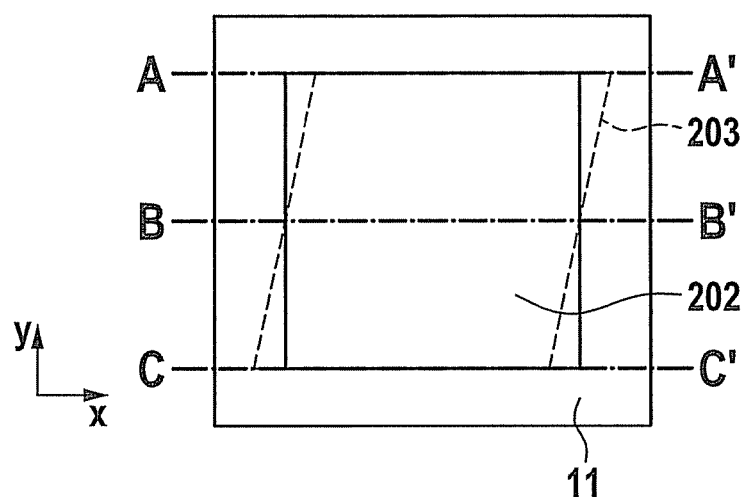
FIG. 2a shows a schematic diagram of a surface structure of a substrate according to a further specific embodiment of the present invention.

FIG. 2a shows a substrate 11 in a top view, in which a recess 202 has been made from the upper main surface. The shape of recess 202 is for example rectangular. Going out from the main surface facing away from the viewing plane, a recess 203 has been made in substrate 11 whose shape is for example that of a parallelogram, as indicated by the broken line in FIG. 2a. Recess 202 can be offset relative to recess 203 in such a way that a large offset occurs in the x direction along a sectional line A-A', while along a sectional line B-B' there is no offset in the x direction, and along a sectional line C-C' there is a large offset in the negative x direction. In this way, along the side edge of recess 202 in the y direction there arises a linearly increasing offset in the x direction. Thus, application of the method explained in FIGS. 1a-1f for forming an oblique surface inside recesses 202, 203 results in a wavelike surface along the y direction in FIG. 2a.

Figure 2B:
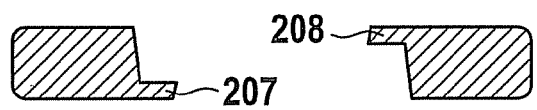
Figure 2C:
Figure 2D:
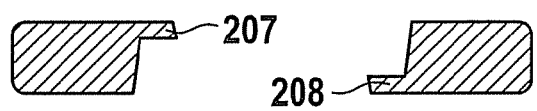

This is explained by the course of substrate projections 207 and 208 along the y direction, as is explained in more detail with reference to FIGS. 2b-2d. FIG. 2b shows a cross-sectional view through substrate 11 along sectional line A-A', FIG. 2c shows a cross-sectional view through substrate 11 along sectional line B-B', and FIG. 2d shows a cross-sectional view through substrate 11 along sectional line C-C'.

In FIG. 2b, a first substrate projection 207 on the underside of substrate 11 in the x direction is situated opposite a second substrate projection 208 on the upper side of substrate 11. The length of these substrate projections 207, 208 in the x direction continuously decreases in the direction of sectional line B-B' until, as shown in FIG. 2c, no substrate projections 207 to 208 are present on sectional line B-B'. Conversely, however, in the direction of sectional line C-C' the length of substrate projections 207, 208 increases, but on the respectively other main surface of substrate 11. As is shown in FIG. 2d, for sectional line C-C' a first substrate projection 207 on the upper side of substrate 11 in the x direction is situated opposite a second substrate projection 208 on the underside of substrate 11.

A person skilled in the art will understand that in addition to the depicted embodiments in FIGS. 1a-1f and 2a, a large number of geometrical dimensions of recesses in a substrate are possible in order to carry out the method according to the present invention and to achieve a large number of oblique and/or curved surfaces inside an opening in a substrate. Concerning this, FIG. 3 shows further possibilities for surface structures of oblique surfaces that can be made in an opening in a substrate 11.

Reference character 31 designates an oblique surface as shown in FIG. 1f. Reference character 32 designates an oblique surface having a constant inclination inside a circular opening. Reference character 33 designates an oblique surface having a constant inclination inside a triangular opening. Reference character 34 designates a radially curved surface inside a semicircular opening. Reference character 35 designates a curved surface having two oblique surface regions having opposite inclination inside rectangular openings.

Reference character 36 designates a curved surface having two oblique surface regions having opposite inclination inside circular openings. Reference character 37 designates a radially curved surface inside a circular opening. Reference character 38 designates a curved surface having three oblique surface regions inside a triangular opening.

Figure 3:
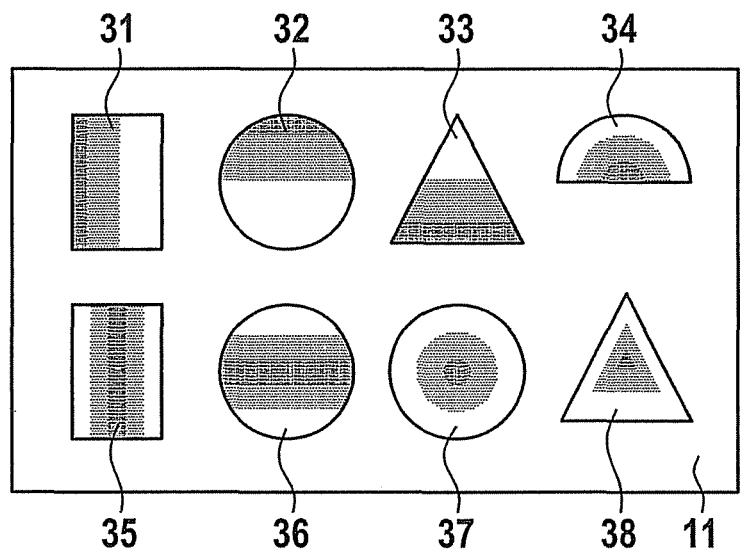
FIG. 3 shows a schematic representation of oblique surfaces produced by a method according to a further specific embodiment of the present invention, in a top view.
Figure 3A:
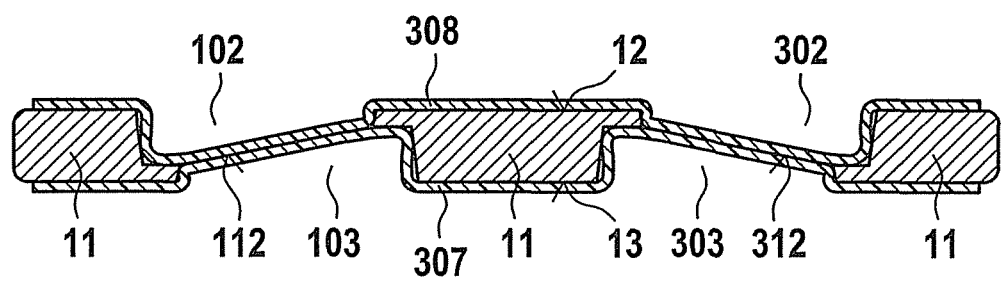
FIG. 3a shows a schematic representation of an oblique surface produced by a method according to a further specific embodiment of the present invention, in a cross-sectional view.

FIG. 3a shows an exemplary embodiment of a device having a substrate 11 and oblique surfaces 112 and 312 according to one of the specific embodiments having reference characters 35, 36, or 37 in FIG. 3. Substrate 11 here can correspond to substrate 11 in FIG. 1a or 2a. First and second recesses 102, 103 can be produced according to the method according to FIGS. 1a-1f. In addition, however, third and fourth recesses 302 and 303 are formed in substrate 11 that are offset in mirror-reflected fashion and laterally relative to first and second recesses 102, 103. The production of third and fourth recesses 302 and 303 can preferably be carried out in a manner similar to the production of first and second recesses 102, 103, in an identical work step.

In addition, flexible diaphragm elements 307, 308 are provided having properties similar to those of flexible diaphragm elements 117, 118 in FIGS. 1d-1f. Here, however, flexible diaphragm elements 307, 308 are dimensioned such that they completely cover both first and second recesses 102, 103 and also third and fourth recesses 302 and 303. By producing a vacuum pressure in first and second recesses 102, 103 and third and fourth recesses 302 and 303 hermetically sealed by flexible diaphragm elements 307, 308, oblique surfaces 112 and 312 can be formed in a manner similar to that described in relation to FIGS. 1e-1f.

Figure 4:
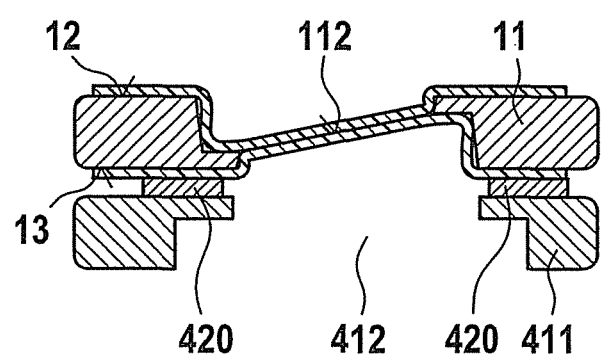
FIG. 4 shows a diagram of a wafer produced by a method according to a further specific embodiment of the present invention.

FIG. 4 shows a diagram of a wafer produced using a method according to a further specific embodiment of the present invention. A substrate 11 having an oblique surface 112, which can be one of the above-designated oblique surfaces in FIGS. 1a-1f, 2a-2d, 3, or 3a, faces, with a main surface 13, a second substrate 411. Substrate 411 can have, in a cavity under oblique surface 112, a microelectromechanical element 412, in particular a micromirror or microactuator. Between substrate 11 and substrate 411, spacer elements 420, in particular a spacer wafer 420, can be attached in order to produce a distance between the two substrates 11 and 411. The thickness of spacer elements 420 can be selected such that a movement of micromechanical element 412 is not impaired by oblique surface 112.

Oblique surface 112 can be made in particular of borosilicate glass, and substrate 11 can include in particular silicon. Oblique surface 112 can in this case act as an optical window over a micromirror 412 in order to keep scattered and reflected radiation away from the micromirror or from the projected image. In addition, oblique surface 112 can act as a protective covering for micromirror 412.

What is claimed is:

1. A method for producing an oblique surface in a substrate, comprising:
   providing a substrate having a first main surface, a second main surface situated opposite the first main surface, and a thickness;
   forming a first recess in a region of a first surface on the first main surface, to a first depth in the substrate;
   forming a second recess in a region of a second surface of the second main surface to a second depth in the substrate, the second surface being laterally displaced relative to the first main surface, and a sum of the first depth and the second depth being greater than the thickness of the substrate;
   applying a first flexible diaphragm on the first main surface over the first recess;
   applying a second flexible diaphragm on the second main surface over the second recess; and
   producing a vacuum pressure inside the first recess and the second recess until the first flexible diaphragm and the second flexible diaphragm contact one another with their surfaces respectively facing the substrate.

2. The method as recited in claim 1, further comprising:
   forming a third recess in a region of a third surface on the first main surface, to a third depth in the substrate;
   forming a fourth recess in a region of a fourth surface of the second main surface, to a fourth depth in the substrate, the fourth surface being offset laterally relative to the third surface, and a sum of the third depth and the fourth depth being greater than the thickness of the substrate;
   applying the first flexible diaphragm on the first main surface over the first recess and the third recess;
   applying the second flexible diaphragm on the second main surface over the second recess and the fourth recess; and
   producing a vacuum pressure inside the third and fourth recess.

3. The method as recited in claim 1, wherein the first flexible diaphragm and the second flexible diaphragm include plastic film.

4. The method as recited in claim 1, wherein the first flexible diaphragm and the second flexible diaphragm include wafers made of one of glass, ceramic, metal, or semiconductor material.

5. The method as recited in claim 1, wherein the application of the first flexible diaphragm and the second flexible diaphragm on the first main surface and the second main surface of the substrate take place in a vacuum.

6. The method as recited in claim 1, wherein the first flexible diaphragm and the second diaphragm that contact one another are one of glued, welded, or soldered to the substrate in a region of their contacting or in a region of the side edges of the first and second recesses.

7. The method as recited in claim 1, wherein the first flexible diaphragm and the second flexible diaphragm are one of glued, welded, or soldered to the substrate on the first and second main surfaces in connection regions that are situated at a distance, along the first and second main surfaces, from side edges of the first and second recess.

8. A wafer for covering a micromechanical element, comprising:
- a substrate having a first main surface, a second main surface situated opposite the first main surface, and a thickness, the substrate having an opening that extends through the thickness of the substrate, the opening having a first lateral limiting edge and a second lateral limiting edge opposite the first lateral limiting edge;
- a first substrate projection that, at a height of the first main surface, protrudes into the opening, going out from the first lateral limiting edge;
- a second substrate projection that, at a height of the second main surface, protrudes into the opening, going out from the second lateral limiting edge; and
- a diaphragm element that extends from the first substrate projection to the second substrate projection and defines, in a region of the opening, a surface that is at an angle to the first main surface.

9. The wafer as recited in claim 8, wherein the substrate includes a silicon substrate and the diaphragm element includes an optically transparent material, the material being one of glass, ceramic material, metal, or plastic material.

\* \* \* \* \*